United States Patent
Chen

(10) Patent No.: US 12,520,729 B2
(45) Date of Patent: Jan. 6, 2026

(54) PIEZOELECTRIC ELEMENT, PIEZOELECTRIC VIBRATOR AND MANUFACTURING METHOD AND DRIVING METHOD THEREOF, AND ELECTRONIC DEVICE

(71) Applicant: BOE Technology Group Co., Ltd., Beijing (CN)

(72) Inventor: Yuju Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1055 days.

(21) Appl. No.: 17/620,529

(22) PCT Filed: Feb. 22, 2021

(86) PCT No.: PCT/CN2021/077221
§ 371 (c)(1),
(2) Date: Dec. 17, 2021

(87) PCT Pub. No.: WO2022/174440
PCT Pub. Date: Aug. 25, 2022

(65) Prior Publication Data
US 2023/0157179 A1    May 18, 2023

(51) Int. Cl.
*H10N 30/87*  (2023.01)
*H10N 30/067*  (2023.01)
(Continued)

(52) U.S. Cl.
CPC ......... *H10N 30/877* (2023.02); *H10N 30/067* (2023.02); *H10N 30/2023* (2023.02); *G06F 3/016* (2013.01); *H10N 39/00* (2023.02)

(58) Field of Classification Search
CPC .................. H10N 30/877; H10N 30/2023
See application file for complete search history.

(56) References Cited

U.S. PATENT DOCUMENTS

2005/0275313 A1*  12/2005  Yamashita ............ B06B 1/0622
                                            310/327
2006/0017352 A1   1/2006  Tanielian
(Continued)

FOREIGN PATENT DOCUMENTS

CN          104427443 A       3/2015
CN          206479965 U       9/2017
(Continued)

*Primary Examiner* — Bryan P Gordon
(74) *Attorney, Agent, or Firm* — IPro, PLLC

(57) ABSTRACT

A piezoelectric element, a piezoelectric vibrator and a manufacturing method and a driving method thereof, and an electronic device, and relates to field of piezoelectric technologies. According to the application, a piezoelectric structure is disposed on a first electrode and has an opening allowing the first electrode to penetrate through to be partially exposed, and a heat conducting structure is disposed in the opening. The opening penetrating through the piezoelectric structure is formed in the piezoelectric structure, such that the heating area is decreased when the piezoelectric structure vibrates, and heat generated by the piezoelectric structure is reduced, correspondingly; and the heat conducting structure is additionally disposed in the piezoelectric element to dissipate heat generated when the piezoelectric structure vibrates.

13 Claims, 4 Drawing Sheets

(51) Int. Cl.
*H10N 30/20* (2023.01)
*G06F 3/01* (2006.01)
*H10N 39/00* (2023.01)

(56) References Cited

U.S. PATENT DOCUMENTS

| | | | | |
|---|---|---|---|---|
| 2009/0062656 | A1* | 3/2009 | Hyuga | A61B 8/4488 |
| | | | | 600/459 |
| 2016/0035962 | A1* | 2/2016 | Yamashita | H03H 9/0552 |
| | | | | 310/348 |
| 2018/0269851 | A1* | 9/2018 | Yamashita | H03H 9/19 |
| 2021/0167274 | A1* | 6/2021 | Zhang | H10N 30/706 |
| 2021/0303100 | A1 | 9/2021 | Huang | |
| 2022/0029603 | A1 | 1/2022 | Luo | |

FOREIGN PATENT DOCUMENTS

| | | |
|---|---|---|
| CN | 207939485 U | 10/2018 |
| CN | 110277971 A | 9/2019 |
| CN | 110502144 A | 11/2019 |
| CN | 110739388 A | 1/2020 |
| CN | 111262542 A | 6/2020 |
| CN | 111786644 A | 10/2020 |
| JP | 2015009394 A | 1/2015 |

* cited by examiner

PIEZOELECTRIC ELEMENT, PIEZOELECTRIC VIBRATOR AND MANUFACTURING METHOD AND DRIVING METHOD THEREOF, AND ELECTRONIC DEVICE

TECHNICAL FIELD

The application relates to the field of piezoelectric technologies, in particular to a piezoelectric element, a piezoelectric vibrator and a manufacturing method and a driving method thereof, and an electronic device.

BACKGROUND

With the rapid development of electronic technologies, users seek ever higher requirements for usage experience. However, most existing electronic devices can only provide visual and acoustic experience, and cannot provide haptic experience for users. So, the haptic rendering technique emerges.

At present, the haptic rendering technique is adopted to provide haptic feedback by means of vibrations of piezoelectric elements configured in electronic devices. However, when existing piezoelectric elements are used, the temperature of the piezoelectric elements may rise due to vibrations of the piezoelectric structure, resulting in a breakdown of the piezoelectric structure and affecting the resonance frequency of the piezoelectric structure.

SUMMARY

Some embodiments of the disclosure provide the following technical solutions:

In a first aspect, the disclosure provides a piezoelectric element, comprising a first electrode and a piezoelectric structure disposed on the first electrode, wherein in a direction perpendicular to a plane where the first electrode is located, the piezoelectric structure has an opening penetrating the piezoelectric structure and exposing part of the first electrode;

Optionally, a heat conducting structure has a thickness of 3 μm-5 μm, the piezoelectric structure has a thickness less than 5 μm, and a second electrode has a thickness of 100 nm-1000 nm.

In a second aspect, the disclosure provides a piezoelectric vibrator, comprising a substrate and at least one piezoelectric element disposed on the substrate, wherein the heat conductivity of the heat conducting structure is greater than that of the substrate.

In a third aspect, the disclosure provides a manufacturing method of a piezoelectric vibrator, comprising:

Forming at least one first electrode on the substrate.

In a fourth aspect, the disclosure provides a driving method of a piezoelectric vibrator, being used for driving the piezoelectric vibrator and comprising:

Inputting a first driving signal to the first electrode of the piezoelectric element, and inputting a second driving signal to the second electrode in the piezoelectric element.

In a fifth aspect, the disclosure provides an electronic device, comprising the piezoelectric vibrator.

In the embodiments of the disclosure, a piezoelectric structure is disposed on a first electrode and has an opening allowing the first electrode to penetrate through to be partially exposed in a direction perpendicular to a plane where the first electrode is located, a heat conducting structure is disposed in the opening, and an orthographic projection of the heat conducting structure on the first electrode does not overlap with an orthographic projection of the piezoelectric structure on the first electrode. The opening penetrating through the piezoelectric structure is formed in the piezoelectric structure, such that the area of the piezoelectric structure in the piezoelectric element is decreased, the heating area is decreased when the piezoelectric structure vibrates, and heat generated by the piezoelectric structure is reduced, correspondingly; in addition, the heat conducting structure is additionally disposed in the piezoelectric element to dissipate heat generated when the piezoelectric structure vibrates, such that the heat-dissipation property of the piezoelectric element is improved, the problems that the piezoelectric structure is broken down and the resonance frequency of the piezoelectric structure is affected due to excessively high temperature of the piezoelectric element are solved, and the reliability of the piezoelectric structure is improved.

The aforesaid description is merely a brief summary of the technical solution of the disclosure. To allow those skilled in the art to gain a better understanding of the technical means of the disclosure so as to implement the disclosure according to the contents in the specification and to make the above and other purposes, features and advantages of the disclosure clearer, specific implementations of the disclosure are given below.

BRIEF DESCRIPTION OF THE DRAWINGS

To more clearly explain the technical solutions of the embodiments of the disclosure or related arts, drawings for describing the embodiments of the disclosure or the related arts will be briefly introduced below. Obviously, the drawings in the following description only illustrate some embodiments of the disclosure, and those ordinarily skilled in the art can obtain other drawings according to the following ones without creative labor.

DETAILED DESCRIPTION

To clarify the purposes, technical solutions and advantages of the embodiments of the disclosure, the technical solutions of the embodiments of the disclosure will be clearly and completely described below in conjunction with the drawings of the embodiments of the disclosure. Obviously, the embodiments in the following description are merely illustrative ones, and are not all possible ones of the disclosure. All other embodiments obtained by those ordinarily skilled in the art based on the following ones without creative labor should also fall within the protection scope of the disclosure.

Figure 1:
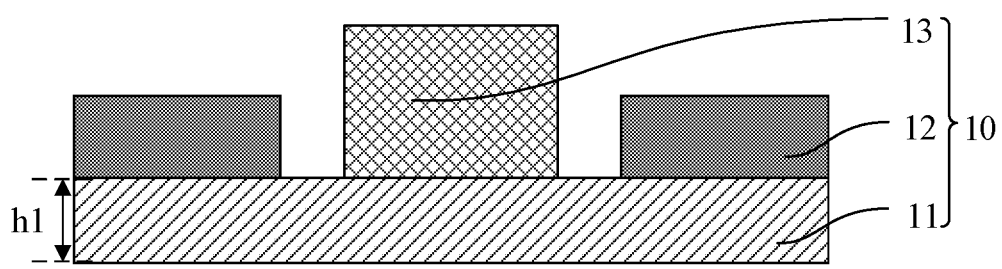
FIG. 1 illustrates a sectional view of a piezoelectric element according to one embodiment of the disclosure.
Figure 2:
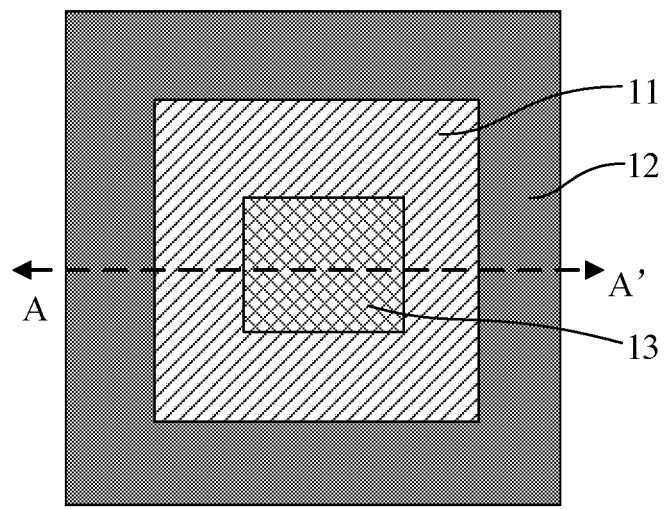
FIG. 2 illustrates a plan view of the piezoelectric element according to one embodiment of the disclosure.

FIG. 1 illustrates a sectional view of a piezoelectric element according to one embodiment of the disclosure, FIG. 2 illustrates a plan view of the piezoelectric element according to one embodiment of the disclosure, and the sectional view illustrated by FIG. 1 is a sectional view along A-A' in FIG. 2.

One embodiment of the disclosure provides a piezoelectric element 10, comprising: a first electrode 11 and a piezoelectric structure 12 disposed on the first electrode 11, wherein in a direction perpendicular to a plane where the first electrode 11 is located, the piezoelectric structure 12 has an opening allowing the first electrode 11 to penetrate through to be partially exposed. The piezoelectric element 10 further comprises a heat conducting structure 13 disposed in the opening, and an orthographic projection of the heat conducting structure 13 on the first electrode 11 does not overlap with an orthographic projection of the first piezoelectric structure 12 on the first electrode 11.

In an actual product, the first electrode 11 refers to a bottom electrode of the piezoelectric element 10, and the first electrode 11 may be a planar electrode and is rectangular. The first electrode 11 is made of a transparent electrically conductive material such as Indium Tin Oxides (ITO), and in the direction perpendicular to the plane where the first electrode 11 is located, the thickness h1 of the first electrode 11 is 100 nm-1000 nm. Certainly, the first electrode 11 may also be made of common metallic materials such as gold (Au) and indium (In). Considering that light may not penetrate through the first electrode 11 if the metallic materials are too thick, the thickness h1 of the first electrode 11 is set to be less than or equal to 20 nm when the first electrode 11 is made of the metallic materials.

The piezoelectric structure 12 is disposed on the first electrode 11, and the orthographic projection of the piezoelectric structure 12 on the first electrode 11 is located in the area of the first electrode 11. The orthographic projection of the piezoelectric structure 12 on the first electrode 11 is annular; and in the direction perpendicular to the plane where the first electrode 11 is located, the piezoelectric structure 12 has the opening allowing the first electrode 11 to penetrate through to be partially exposed, and the opening may be of any closed shapes, such as rectangular, circular and hexagonal.

Wherein, the piezoelectric structure 12 is made of piezoelectric ceramic (PZT). For example, the piezoelectric ceramic may be made of PZT binary system piezoelectric ceramic, which has a chemical formula of $Pb(Zr_{1-x}Ti_x)O_3$ and is of a $ABO_3$ perovskite structure.

When the opening penetrating through the piezoelectric structure 12 is formed in the piezoelectric structure 12, the area of the piezoelectric structure 12 in the piezoelectric element 10 is decreased, the heating area is decreased when the piezoelectric structure 12 vibrates, and heat generated by the piezoelectric structure 12 is reduced, correspondingly.

In addition, the heat conducting structure 13 is disposed in the opening formed in the piezoelectric structure 12 to dissipate heat generated when the piezoelectric structure 12 vibrates, such that the heat-dissipation property of the piezoelectric element 10 is improved.

When the heat-dissipation property of the piezoelectric element 10 is poor, the temperature of the piezoelectric element 10 will rise, which in turn reduces a potential barrier between electrodes on two sides of the piezoelectric structure 12, and electron transfer may occur between the electrodes on the two sides of the piezoelectric structure 12 and result in a breakdown of the piezoelectric structure 12; in addition, when the temperature of the piezoelectric structure 12 rises, the dielectric loss of the piezoelectric structure 12 will be increased, which will further increase the temperature of the piezoelectric element 10 and result in a breakdown of the piezoelectric structure 12; moreover, when the temperature of the piezoelectric element 10 rises, the resonance frequency of the piezoelectric structure 12 will be decreased, and consequentially, the frequency of the piezoelectric structure 12 will be unable to meet requirements when the piezoelectric structure 12 vibrates.

In this embodiment of the disclosure, the heat-dissipation property of the piezoelectric element 10 is improved by reducing the heating area of the piezoelectric structure 12 and adding the heat conducting structure 13 in the piezoelectric element 10, such that the temperature of the piezoelectric element 10 is prevented from being excessively high, the piezoelectric structure 12 is effectively prevented from being broken down, it is ensured that the frequency of the piezoelectric structure 12 meets actual requirement when the piezoelectric structure 12 vibrates, and the reliability of the piezoelectric structure 12 is improved; in addition, the temperature around the piezoelectric element 10 is also decreased, and the situation where the haptic feeling of users is affected due to excessively high temperature is avoided.

In addition, in an actual product, an orthographic projection of the heat conducting structure 13 on the first electrode 11 does not overlap with the orthographic projection of the piezoelectric structure 12 on the first electrode 11, that is to say, the heat conducting structure 13 does not contact with the piezoelectric structure 12. Considering that the heat conducting structure 13 will affect the vibration effect of the piezoelectric structure 12 if contacting with the piezoelectric structure 12, the orthographic projection of the heat conducting structure 13 on the first electrode 11 is prevented from overlapping with the orthographic projection of the piezoelectric structure 12 on the first electrode 11 in this embodiment of the disclosure, such that the vibration effect of the piezoelectric structure 12 is improved.

In this embodiment of the disclosure, the heat conducting structure 13 is made of a heat conducting metal, such as a metallic material with a high heat conductivity like aluminum (Al) or copper (Cu), wherein the heat conductivity of aluminum is 237 w/(m·k).

Of course, the heat conducting structure 13 may also be made of other transparent heat conducting materials such as aluminum nitride, boron nitride, silicon carbide, magnesium oxide and aluminum oxide, wherein the heat conductivity of the aluminum nitride is 80-320 w/(m·k), the heat conductivity of the boron nitride is 125 w/(m·k), the heat conductivity of the silicon carbide is 83.6 w/(m·k), the heat conductivity of the magnesium oxide is 36 w/(m·k), and the heat conductivity of the aluminum oxide is 30 w/(m·k).

When the heat conducting structure 13 is made of aluminum, the cost and manufacturing process difficulty of the heat conducting structure 13 may be reduced.

Specifically, the opening ratio of the piezoelectric structure 12 is 10%-70%. The opening ratio of the piezoelectric structure 12 refers to the ratio of the area of an orthographic projection of the opening in the piezoelectric element 10 on the first electrode 11 to the sum of the area of the orthographic projection of the piezoelectric structure 12 on the first electrode 11 and the area of the orthographic projection of the opening on the first electrode 11, namely the ratio of the area of the orthographic projection of the opening on the first electrode 11 to the area of a closed pattern defined by an orthographic projection of a side, away from the opening, of the piezoelectric structure 12 on the first electrode 11.

Figure 3:
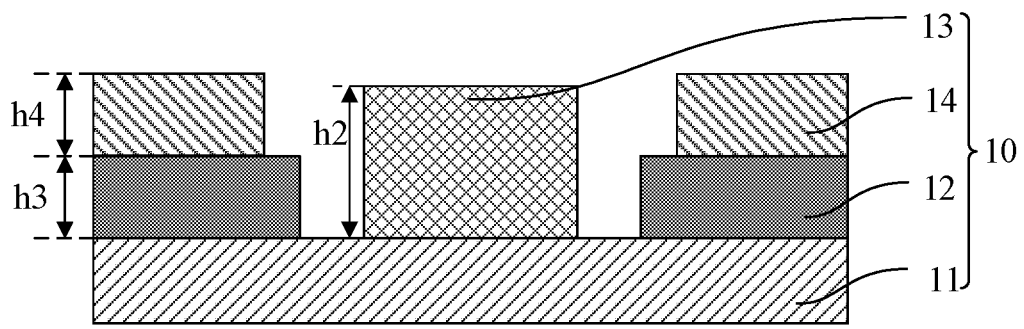
FIG. 3 illustrates a sectional view of another piezoelectric element according to one embodiment of the disclosure.

As shown in FIG. 3, the piezoelectric element 10 further comprises a second electrode 14 disposed on a side, away from the first electrode 11, of the piezoelectric structure 12, and an orthographic projection of the second electrode 14 on the first electrode 11 is located within the orthographic projection of the piezoelectric structure 12 on the first electrode 11.

The second electrode 14 is disposed on the side, away from the first electrode 11, of the piezoelectric structure 12, and is a top electrode of the piezoelectric element 10, and the orthographic projection of the second electrode 14 on the first electrode 11 is also annular. The second electrode 14 may be made of a transparent electrically conductive material such as ITO. Of course, the second electrode 14 may also be made of common metallic materials such as Au and In, and the thickness h1 of the first electrode 11 may be equal to the thickness h4 of the second electrode 14.

In an actual product, the orthographic projection of the second electrode 14 on the first electrode 11 may overlap with the orthographic projection of the piezoelectric structure 12 on the first electrode 11, but the area of the orthographic projection of the second electrode 14 on the first electrode 11 is smaller than the area of the orthographic projection of the piezoelectric structure 12 on the first electrode 11 under the influence of the process, that is, the orthographic projection of the second electrode 14 on the first electrode 11 is located within the orthographic projection of the piezoelectric structure 12 on the first electrode 11, such that the second electrode 14 will not cover the opening of the piezoelectric structure 12.

In this embodiment of the disclosure, in the direction perpendicular to the plane where the first electrode 11 is located, the thickness h2 of the heat conducting structure 13 is less than or equal to the sum of the thickness of the piezoelectric structure 12 and the thickness of the second electrode 14.

As shown in FIG. 3, the thickness of the piezoelectric structure 12 is h3, the thickness of the second electrode 14 is h4, and the thickness h2 of the heat conducting structure 13 is smaller than or equal to (h3+h4); and the thickness h2 of the heat conducting structure 13 is greater than the thickness h3 of the piezoelectric structure 12.

The thickness h2 of the heat conducting structure 13 is less than or equal to the sum of the thickness of the piezoelectric structure 12 and the thickness of the second electrode 14, and the thickness h2 of the heat conducting structure 13 is greater than the thickness h3 of the piezoelectric structure 12, such that the surface area of the heat conducting structure 13 is enlarged, thus improving the heat-dissipation effect of the heat conducting structure 13.

Wherein, the thickness h2 of the heat conducting structure 13 is 3 μm-5 μm, the thickness h3 of the piezoelectric structure 12 is less than 5 μm, and the thickness h4 of the second electrode 14 is 100 nm-1000 nm.

For example, the thickness h2 of the heat conducting structure 13 is set as 3.5 μm, the thickness h3 of the piezoelectric structure 12 is set as 3 μm, and the thickness h4 of the second electrode 14 is set as 600 nm, such that the thickness h2 of the heat conducting structure 13 is smaller than or equal to the sum of the thickness of the piezoelectric structure 12 and the thickness of the second electrode 14.

It is proved by testing that the piezoelectric element 10 in this embodiment of the disclosure is able to greatly reduce a temperature rise caused by vibrations of the piezoelectric structure 12, and the temperature may be decreased by 50% without affecting the performance of the piezoelectric element 10.

In this embodiment of the disclosure, the opening penetrating through the piezoelectric structure is formed in the piezoelectric structure, such that the area of the piezoelectric structure in the piezoelectric element is decreased, the heating area of the piezoelectric structure is decreased when the piezoelectric structure vibrates, and heat generated by the piezoelectric structure is reduced, correspondingly; in addition, the heat conducting structure is additionally disposed in the piezoelectric element to dissipate heat generated when the piezoelectric structure vibrates, such that the heat-dissipation property of the piezoelectric element is improved, the problems that the piezoelectric structure is broken down and the resonance frequency of the piezoelectric structure is affected due to excessively high temperature of the piezoelectric element are solved, and the reliability of the piezoelectric structure is improved.

Figure 4:
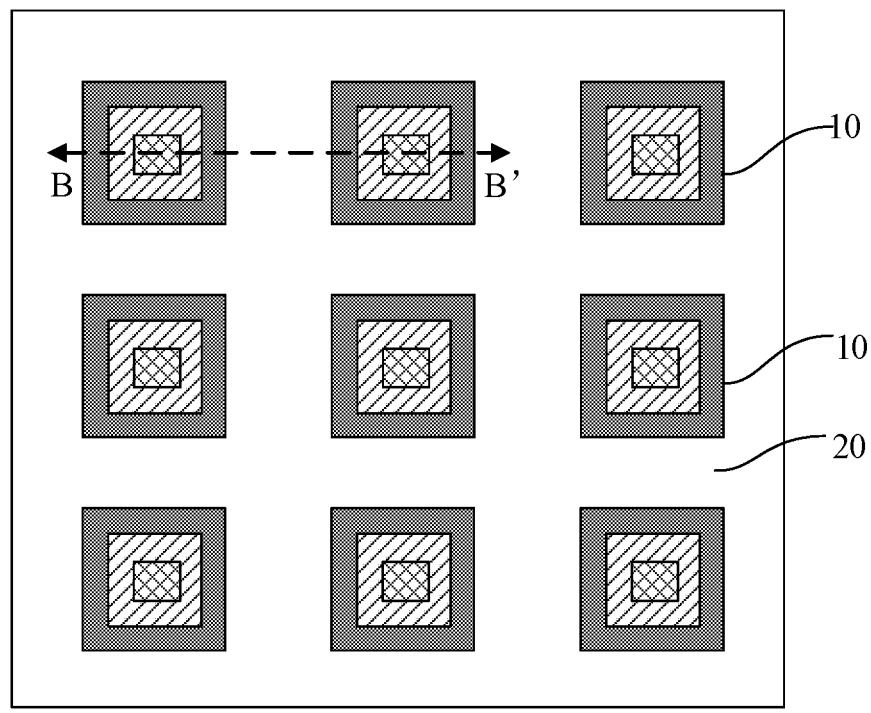
FIG. 4 illustrates a plan view of a piezoelectric vibrator according to one embodiment of the disclosure.
Figure 5:
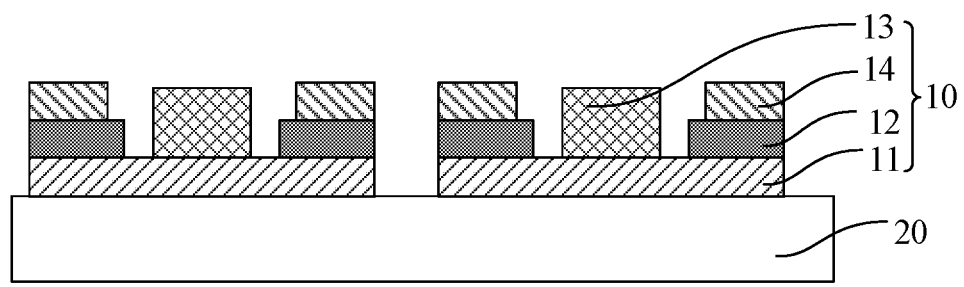
FIG. 5 illustrates a sectional view of a piezoelectric vibrator according to one embodiment of the disclosure.

FIG. 4 illustrates a plan view of a piezoelectric vibrator according to one embodiment of the disclosure, FIG. 5 illustrates a sectional view of the piezoelectric vibrator according to one embodiment of the disclosure, and the sectional view illustrated by FIG. 5 is a sectional view along B-B' in FIG. 4.

One embodiment of the disclosure further provides a piezoelectric vibrator, comprising a substrate 20 and at least one piezoelectric element 10 disposed on the substrate 20, wherein the heat conductivity of the heat conducting structure 13 is greater than that of the substrate 20.

Wherein, the substrate 20 may be a flexible substrate or a rigid substrate. For example, the flexible substrate may be made of PI (Polyimide), PET (Polyethylene Terephthalate), or PDMS (Polydimethylsiloxane), and the rigid substrate may be made of glass.

At least one piezoelectric element 10 is disposed on the substrate 20. Specifically, the substrate 20 is disposed on a side, away from the piezoelectric structure 12, of the first electrode 11, that is, the substrate 20 directly contacts with the first electrode 11 in the piezoelectric element 10.

If each piezoelectric element 10 is not provided with the heat conducting structure 13, heat generated due to vibrations of the piezoelectric structure 12 in the piezoelectric element 10 will be transmitted to the substrate 20 via the first electrode 11 and is then dissipated by the substrate 20, but the heat conductivity of the substrate 20 is low, for example, the heat conductivity of a glass substrate is only 1.22 w/(m·k), and heat will be accumulated on the piezoelectric element 10 due to the unsatisfying heat-dissipation effect of the substrate 20, thus increasing the temperature of the piezoelectric element 10.

In this embodiment of the disclosure, the heat conducting structure 13 is additionally disposed in each piezoelectric element 10, heat generated due to vibrations of the piezoelectric structure 12 in the piezoelectric element 10 is transferred to the heat conducting structure 13 via the first electrode 11, or the heat is transferred to the substrate 20 via the first electrode 11 and is then transferred to the heat conducting structure 13 via the substrate 20 and the first electrode 11, and the heat conductivity of the heat conducting structure 13 is superior to that of the substrate 20, such that the heat-dissipation effect of the heat conducting structure 13 is better, thus preventing heat from being accumulated on the piezoelectric element 10 and preventing the temperature of the piezoelectric element 10 from being too high.

Furthermore, the piezoelectric vibrator further comprises a first signal line connected to each first electrode 11 and a second signal line connected to each second electrode 14, wherein the first signal lines are used for providing first driving signals for the first electrodes 11, and the second signal lines are used for providing second driving signals for the second electrodes 14. Wherein, the first signal lines and the second signal lines are made of electrically conductive materials. For example, the first signal lines and the second signal lines are made of metal, alloy, or the like.

It should be noted that the first electrodes 11 and the second electrodes 14 of any two adjacent piezoelectric elements 10 in the piezoelectric vibrator are disconnected, such that vibrations of each piezoelectric element 10 may be controlled separately. Or, the first electrodes 11 of all the piezoelectric elements 10 in the piezoelectric vibrator are of an integrated structure, that is, the first electrodes 11 of all the piezoelectric elements 10 in the piezoelectric vibrator are connected, and in this case, all the piezoelectric elements in the piezoelectric vibrator share the same first electrode 11, and the second electrodes 14 are disconnected.

One embodiment of the disclosure further provides an electronic device, comprising the piezoelectric vibrator.

In an actual product, the electronic device may be a displaying device, comprising a display panel and the piezoelectric vibrator, wherein the piezoelectric vibrator may be disposed on an emission side of the display panel, such that the displaying device has both a display function and a haptic rendering function.

In some embodiments, the display panel of the displaying device is an embedded touch display panel.

In some embodiments, the displaying device further comprises a touch base plate disposed between the display panel and the piezoelectric vibrator.

Of course, the electronic device in this embodiment of the disclosure is not limited to the displaying device, and may be any other products or components with a haptic rendering function.

In this embodiment of the disclosure, an opening penetrating through the piezoelectric structure is formed in the piezoelectric structure, such that the area of the piezoelectric structure in the piezoelectric element is decreased, the heating area is decreased when the piezoelectric structure vibrates, and heat generated by the piezoelectric structure is reduced, correspondingly; in addition, a heat conducting structure is additionally disposed in the piezoelectric element to dissipate heat generated when the piezoelectric structure vibrates, such that the heat-dissipation property of the piezoelectric element is improved, the problems that the piezoelectric structure is broken down and the resonance frequency of the piezoelectric structure is affected due to excessively high temperature of the piezoelectric element are solved, and the reliability of the piezoelectric structure is improved.

Figure 6:
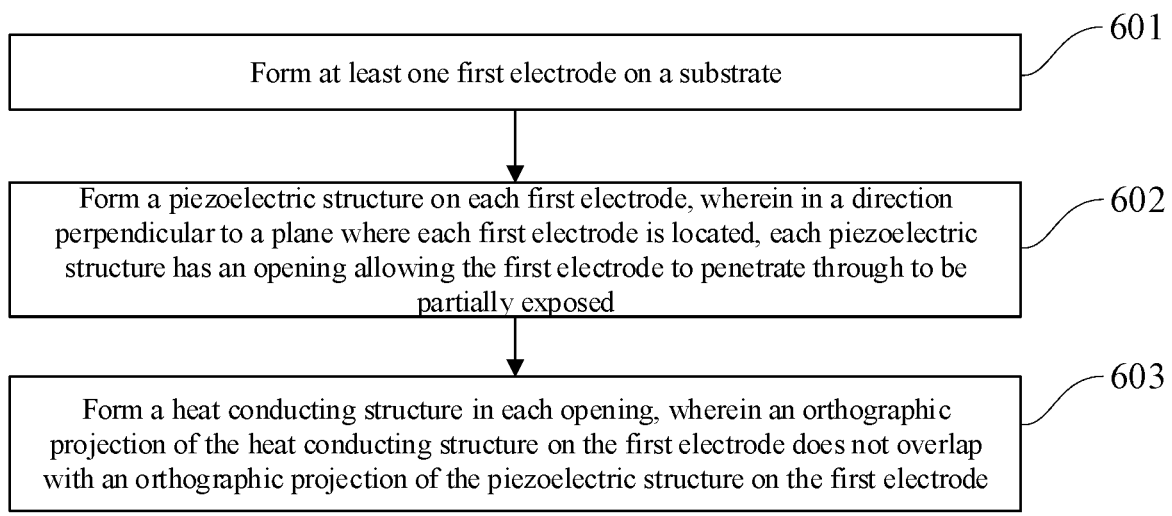
FIG. 6 illustrates a flow diagram of a manufacturing method of a piezoelectric vibrator according to one embodiment of the disclosure.

Referring to FIG. 6 which illustrates a flow diagram of a manufacturing method of a piezoelectric vibrator according to one embodiment of the disclosure, the manufacturing method may specifically comprise the following steps:

Step 601: at least one first electrode is formed on a substrate.

In this embodiment of the disclosure, a substrate 20 is provided first, wherein the substrate 20 may be a flexible substrate or a rigid substrate; and then, at least one first electrode 11 is formed on the substrate 20 by a patterning process.

Specifically, a first electrode film is deposited on the substrate 20 and is then subjected to thermal annealing in a nitrogen environment to decrease the electrical resistivity of the first electrode film; then, the first electrode film is coated with a photoresist, and the photoresist is exposed and developed; and next, an area, with the photoresist being removed, of the first electrode film is etched, and the residual photoresist is removed, such that at least one first electrode 11 is formed on the substrate 20, wherein the first electrode 11 may be made of ITO.

Step 602: a piezoelectric structure is formed on each first electrode; and in a direction perpendicular to a plane where each first electrode is located, each piezoelectric structure has an opening allowing the first electrode to penetrate through to be partially exposed.

In this embodiment of the disclosure, after at least one first electrode 11 is formed on the substrate 20, a piezoelectric structure 12 is formed on each first electrode 11, and in the direction perpendicular to the plane where each first electrode 11 is located, each piezoelectric structure 12 has an opening allowing the first electrode to penetrate through to be partially exposed, wherein the opening ratio of each piezoelectric structure 12 is 10%-70%.

Specifically, step 602 comprises a sub-step S6021, a sub-step S6022 and a sub-step S6023:

Sub-step S6021: a piezoelectric film covering the first electrodes and the substrate is formed;

Sub-step S6022: thermal annealing and laser annealing are performed on the piezoelectric film;

Sub-step S6023: the piezoelectric film is patterned to form the piezoelectric structure on each first electrode.

Optionally, after at least one first electrode 11 is formed on the substrate 20, a piezoelectric film covering the first electrodes 11 and the substrate 20 is formed by a dry film coating method or a sol-gel method; next, the structure formed with the piezoelectric film is placed in an air environment at 550° C.-600° C. to be subjected to RTA (Rapid Thermal Annealing), the piezoelectric film is radiated with laser during thermal annealing to perform laser annealing on the piezoelectric film, and the grain size and degree of crystallization of the piezoelectric film are improved by performing thermal annealing and laser annealing on the piezoelectric film, thus reducing the dielectric loss of the piezoelectric film; and finally, after being subjected to thermal annealing and laser annealing, the piezoelectric film is coated with a photoresist, then the photoresist is exposed and developed, next, an area, with the photoresist being removed, of the piezoelectric film is etched, and finally, the residual photoresist is removed, such that the piezoelectric structure 12 is formed on each first electrode 11.

Figure 7:
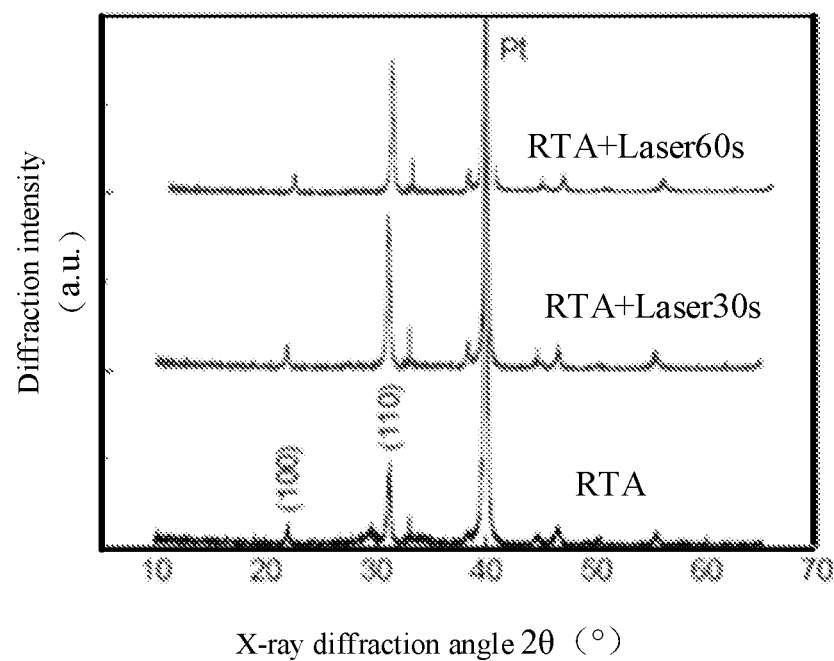
FIG. 7 illustrates an XRD spectrum of a piezoelectric structure according to one embodiment of the disclosure.

It is detected by testing that the XRD (X-ray diffraction) spectrum in FIG. 7 may be obtained by performing X-ray diffraction on the piezoelectric structure formed under different conditions, wherein the horizontal axis represents the X-ray diffraction angle, and the vertical axis represents the diffraction intensity.

FIG. 7 illustrates three diffraction curves which are respectively a diffraction curve of a piezoelectric structure obtained only by thermal annealing (such as at a temperature of 550° C.), a diffraction curve of a piezoelectric structure obtained by thermal annealing (such as at a temperature of 550° C.) and laser radiation for 30 s, and a diffraction curve of a piezoelectric structure obtained by thermal annealing (such as at a temperature of 550° C.) and laser radiation for 60 s. As can be seen from FIG. 7, each of the three diffraction curves has two diffraction peaks which are a diffraction peak of the piezoelectric structure along a crystal plane (100) and a diffraction peak of the piezoelectric structure along a crystal plane (110).

It can be known, by analysis, that the ratio of the diffraction intensity of the piezoelectric structure obtained only by thermal annealing along the crystal face (110) to the diffraction intensity of the piezoelectric structure along the crystal face (100) is 10:1; and the ratio of the diffraction intensity of the piezoelectric structure obtained by thermal annealing and laser radiation along the crystal face (110) to the diffraction intensity of the piezoelectric structure along the crystal face (100) is greater than 20:1, and the grain size of the piezoelectric structure is 30 nm-50 nm. Thus, the grain size and degree of crystallization of the piezoelectric structure 12 obtained by thermal annealing and laser radiation in this embodiment of the disclosure are improved, which in turn further decreases the dielectric loss of the piezoelectric structure 12. It is proved by testing that the dielectric dissipation factor may be decreased below 0.01 and may be further decreased below 0.005.

It should be noted that the diffraction peak of Pt (platinum) in FIG. 7 is mainly used as a reference crystal face for determining the actual diffraction intensities of the piezoelectric structure along the crystal face (110) and the crystal face (100), and the piezoelectric element 10 is not provided with a film layer made of Pt.

In addition, laser annealing may be performed during thermal annealing, that is, the piezoelectric film is radiated with laser in a thermal annealing environment. Or, laser annealing may be performed after thermal annealing and cooling are finished. However, the piezoelectric structure 12 obtained by performing thermal annealing and laser annealing on the piezoelectric film at the same time has better performance.

Thermal annealing is performed on the piezoelectric film at a temperature of 550° C.-600° C. If the temperature of thermal annealing is over 600° C., the substrate 20 may deform. So, in this embodiment of the disclosure, the temperature of thermal annealing is reasonably controlled to protect the substrate 20 against deformation under high temperature. When laser annealing is performed on the piezoelectric film, the time of laser radiation is related to the intensity of laser, the thickness of the piezoelectric film, and the like, and the embodiments of the disclosure have no limitation in this aspect.

Step 603: a heat conducting structure is formed in each opening, wherein an orthographic projection of the heat conducting structure on the first electrode does not overlap with an orthographic projection of the piezoelectric structure on the first electrode.

In this embodiment of the disclosure, after the piezoelectric structure 12 is formed in each first electrode 11, a heat conducting structure 13 is formed in the opening of each piezoelectric structure 12, and the orthographic projection of the heat conducting structure 13 on the first electrode 11 does not overlap with the orthographic projection of the piezoelectric structure 12 on the first electrode 11.

Specifically, a heat conducting film covering the piezoelectric structures 12 and the first electrodes 11 is formed and is then coated with a photoresist, and then, the photoresist is exposed and developed; next, an area, with the photoresist being removed, of the heat conducting film is etched, and finally, the residual photoresist is removed, such that the heat conducting structure 13 is formed in the opening of each piezoelectric structure 12.

Optionally, after step 603, the method further comprises: a second electrode is formed on a side, away from the first electrode, of each piezoelectric structure; and an orthographic projection of the second electrode on the first electrode is located within the orthographic projection of the piezoelectric structure on the first electrode.

After the heat conducting structure 13 is formed in the opening of each piezoelectric structure 12, a second electrode film covering the heat conducting structures 13, the piezoelectric structures 12, the first electrodes 11 and the substrate 20 is formed and is then coated with a photoresist, and then, the photoresist is exposed and developed; next, an area, with the photoresist being removed, of the second electrode film is etched, and finally, the residual photoresist is removed, such that a second electrode 14 is formed on a side, away from the first electrode 11, of each piezoelectric structure 12, wherein the orthographic projection of the second electrode 14 on the first electrode 11 is located within the orthographic projection of the piezoelectric structure 12 on the first electrode 11, and the second electrode 14 is also made of ITO.

The piezoelectric element 10 is polarized later to increase the piezoelectric constant of the piezoelectric structure 12 in the piezoelectric element 10, such that the piezoelectric element 10 has a good piezoelectric property.

In this embodiment of the disclosure, the opening penetrating through the piezoelectric structure is formed in the piezoelectric structure, such that the area of the piezoelectric structure in the piezoelectric element is decreased, the heating area is decreased when the piezoelectric structure vibrates, and heat generated by the piezoelectric structure is reduced, correspondingly; in addition, the heat conducting structure is additionally disposed in the piezoelectric element to dissipate heat generated when the piezoelectric structure vibrates, such that the heat-dissipation property of the piezoelectric element is improved, the problems that the piezoelectric structure is broken down and the resonance frequency of the piezoelectric structure is affected due to excessively high temperature of the piezoelectric element are solved, and the reliability of the piezoelectric structure is improved.

One embodiment of the disclosure further provides a driving method of a piezoelectric vibrator. The driving method is used for driving the piezoelectric vibrator shown in FIG. 4 and FIG. 5 and comprises:

Step S01: a first driving signal is input to the first electrode of the piezoelectric element, and a second driving signal is input to the second electrode of the piezoelectric element, wherein the second driving signal is divided into a first stage and a second stage, the second driving signal in the first stage is a pulse signal, the voltage of the second driving signal in the second stage is a preset voltage, and the voltage of the first driving signal is also the preset voltage.

In an actual product, the first electrode 11 in each piezoelectric element 10 is connected to a first signal line, and the second electrode 14 in each piezoelectric element 10 is connected to a second signal line; and when vibrations of the piezoelectric structures 12 in any one or more piezoelectric elements 10 need to be controlled, first driving signals are input to the first electrodes 11 in the corresponding piezoelectric elements 10 through the first signal lines, and second driving signals are input the second electrodes 14 in the corresponding piezoelectric elements 10 through the second signal lines.

In addition, the second driving signal is divided into multiple cycles, and each cycle is divided into a first stage and a second stage, wherein the second driving signal in the first stage is a pulse signal and has a frequency greater than 500 Hz, the voltage of the second driving signal in the second stage is a preset voltage, and the voltage of the first driving signal in each stage is also the preset voltage.

The preset voltage may be 0V, that is, in the first stage, the second driving signal is a pulse signal, such that an electric field is formed by a pressure difference between the first electrode 11 and the second electrode 14 on two sides of the piezoelectric structure 12, and the piezoelectric structure 12 vibrates under the effect of the electric field; and in the second stage, the voltage of the first driving signal and the voltage of the second driving signal are 0V, no pressure difference exists between the first electrode 11 and the second electrode 14, and the piezoelectric structure 12 does not vibrate.

In an actual product, the first electrodes 11 may be grounded by means of the first signal lines; or, the first signal lines continuously input low-voltage signals to the first electrodes 11.

In this embodiment of the disclosure, the piezoelectric element 10 is driven by duty rather than being driven continuously, that is, the piezoelectric structure 12 is controlled to vibrate in the first stage in one cycle, and is controlled not to vibrate in the second stage of this cycle, and the piezoelectric structure 12 is controlled to vibrate again in the first stage in the next cycle.

When the piezoelectric element 10 is driven by duty, power consumption of the piezoelectric element 10 is reduced, and heat generated by the piezoelectric structure 12 is further reduced.

Wherein, the ratio of the duration of the first stage to the duration of the second stage is from 1:1 to 1:10. For example, the ratio of the duration of the first stage to the duration of the second stage is set as 2:1 or 3:1.

By reasonably setting the duration of the pulse signal in the second driving signal and the duration of the preset voltage, power consumption of the piezoelectric element 10 may be reduced without affecting the actual haptic effect of users, and heat generated by the piezoelectric structure 12 is further reduced.

In this embodiment of the disclosure, the opening penetrating through the piezoelectric structure is formed in the piezoelectric structure, such that the area of the piezoelectric structure in the piezoelectric element is decreased, the heating area is decreased when the piezoelectric structure vibrates, and heat generated by the piezoelectric structure is reduced, correspondingly; in addition, the heat conducting structure is additionally disposed in the piezoelectric element to dissipate heat generated when the piezoelectric structure vibrates, such that the heat-dissipation property of the piezoelectric element is improved, the problems that the piezoelectric structure is broken down and the resonance frequency of the piezoelectric structure is affected due to excessively high temperature of the piezoelectric element are solved, and the reliability of the piezoelectric structure is improved.

"One embodiment", "an embodiment" or "one or more embodiments" in this specification means that specific features, structures, or characteristics described in conjunction with said embodiment are included in at least one embodiment of the disclosure. In addition, it should be noted that the expression "in one embodiment" does not definitely refer to the same embodiment.

A great plenty of specific details are provided in this specification. However, it can be understood that the embodiments of the disclosure can be implemented even without these specific details. In some embodiments, known methods, structures and techniques are not stated in detail to ensure that the understanding of this specification will not be obscured.

In the Claims, any reference marks should not be construed as limitations of the Claims. The term "comprise" shall not exclude the existence of elements or steps not listed in the Claims. "A/an" or "one" before an element shall not exclude the possibility of multiple said elements. The disclosure may be implemented by means of hardware comprising a plurality of different elements and a properly programmed computer. In a claim in which a plurality of devices are listed, several of these devices may be specifically implemented by means of the same hardware. Terms such as "first", "second" and "third" do not indicate any order, and may be interpreted as names.

Finally, it should be noted that the above embodiments are merely used to explain the technical solutions of the disclosure, and are not intended to limit the disclosure. Although the disclosure has been explained in detail with reference to the above embodiments, those ordinarily skilled in the art would appreciate that the technical solutions recorded in these embodiments can still be amended or part of the technical features in these embodiments can be equivalently substituted without causing the essence of corresponding technical solutions to deviate from the spirit and scope of the technical solutions of these embodiments.

The invention claimed is:

1. A piezoelectric element, comprising a first electrode and a piezoelectric structure disposed on the first electrode, wherein in a direction perpendicular to a plane where the first electrode is located, the piezoelectric structure has an opening penetrating the piezoelectric structure and exposing part of the first electrode;
the piezoelectric element further comprises a heat conducting structure disposed in the opening, and an orthographic projection of the heat conducting structure on the first electrode does not overlap with an orthographic projection of the piezoelectric structure on the first electrode;
the piezoelectric element further comprising a second electrode disposed on a side, away from the first electrode, of the piezoelectric structure, wherein an orthographic projection of the second electrode on the first electrode is located within the orthographic projection of the piezoelectric structure on the first electrode;
wherein in the direction perpendicular to the plane where the first electrode is located, a thickness of the heat conducting structure is less than or equal to the sum of a thickness of the piezoelectric structure and a thickness of the second electrode.

2. The piezoelectric element according to claim 1, wherein an opening ratio of the piezoelectric structure is 10%-70%.

3. The piezoelectric element according to claim 1, wherein the thickness of the heat conducting structure is 3 μm-5 μm, the thickness of the piezoelectric structure is less than 5 μm, and the thickness of the second electrode is 100 nm-1000 nm.

4. The piezoelectric element according to claim 1, wherein the heat conducting structure is made of a heat conducting metal.

5. A piezoelectric vibrator, comprising a substrate and at least one of the piezoelectric elements according to claim 1, wherein a heat conductivity of the heat conducting structure is greater than a heat conductivity of the substrate.

6. A driving method of a piezoelectric vibrator, being used for driving the piezoelectric vibrator according to claim 5, and comprising:
inputting a first driving signal to the first electrode in the piezoelectric element, and inputting a second driving signal to the second electrode in the piezoelectric element;
wherein, the second driving signal is divided into a first stage and a second stage, the second driving signal in the first stage is a pulse signal, a voltage of the second driving signal in the second stage is a preset voltage, and a voltage of the first driving signal is also the preset voltage.

7. The driving method of the piezoelectric vibrator according to claim 6, wherein a ratio of the duration of the first stage to the duration of the second stage is from 1:1 to 1:10.

8. An electronic device, comprising the piezoelectric vibrator according to claim 5.

9. The piezoelectric vibrator according to claim 5, wherein an opening ratio of the piezoelectric structure is 10%-70%.

10. The piezoelectric vibrator according to claim 5, further comprising a second electrode disposed on a side, away from the first electrode, of the piezoelectric structure, wherein an orthographic projection of the second electrode on the first electrode is located within the orthographic projection of the piezoelectric structure on the first electrode.

11. The piezoelectric vibrator according to claim 5, wherein the heat conducting structure is made of a heat conducting metal.

12. The piezoelectric vibrator according to claim 10, wherein in the direction perpendicular to the plane where the first electrode is located, a thickness of the heat conducting structure is less than or equal to the sum of a thickness of the piezoelectric structure and a thickness of the second electrode.

13. The piezoelectric vibrator according to claim 12, wherein the thickness of the heat conducting structure is 3 µm-5 µm, the thickness of the piezoelectric structure is less than 5 µm, and the thickness of the second electrode is 100 nm-1000 nm.

\* \* \* \* \*